United States Patent
Corisis et al.

(10) Patent No.: US 7,098,527 B2
(45) Date of Patent: *Aug. 29, 2006

(54) INTEGRATED CIRCUIT PACKAGE ELECTRICAL ENHANCEMENT WITH IMPROVED LEAD FRAME DESIGN

(75) Inventors: David J. Corisis, Meridian, ID (US); Jerry M. Brooks, Caldwell, ID (US)

(73) Assignee: Micron Technology, Inc., Boise, ID (US)

( * ) Notice: Subject to any disclaimer, the term of this patent is extended or adjusted under 35 U.S.C. 154(b) by 197 days.

This patent is subject to a terminal disclaimer.

(21) Appl. No.: 10/633,851

(22) Filed: Aug. 4, 2003

(65) Prior Publication Data

US 2004/0026774 A1 Feb. 12, 2004

Related U.S. Application Data

(63) Continuation of application No. 10/218,335, filed on Aug. 13, 2002, now Pat. No. 6,630,733, which is a continuation of application No. 09/943,845, filed on Aug. 30, 2001, now Pat. No. 6,445,067, which is a continuation of application No. 09/539,092, filed on Mar. 30, 2000, now Pat. No. 6,329,710, which is a continuation of application No. 09/294,185, filed on Apr. 19, 1999, now Pat. No. 6,087,720, which is a continuation of application No. 09/047,726, filed on Mar. 25, 1998, now Pat. No. 5,907,184, which is a continuation of application No. 08/713,798, filed on Sep. 13, 1996, now Pat. No. 5,763,945.

(51) Int. Cl.
*H01L 23/495* (2006.01)

(52) U.S. Cl. ............ 257/666; 257/676; 257/677; 257/690; 257/691; 257/692

(58) Field of Classification Search ............ 257/666, 257/676, 677, 690, 691, 692
See application file for complete search history.

(56) References Cited

U.S. PATENT DOCUMENTS

| | | | |
|---|---|---|---|
| 4,470,868 A | | 9/1984 | MacLaughlin et al. |
| 4,504,435 A | * | 3/1985 | Orcutt .............. 264/272.17 |
| 4,680,617 A | | 7/1987 | Ross |
| 4,740,868 A | | 4/1988 | Hawkins |
| 4,862,245 A | | 8/1989 | Pashby |
| 4,965,654 A | | 10/1990 | Karner et al. |
| 5,229,639 A | | 7/1993 | Hansen et al. |
| 5,229,846 A | | 7/1993 | Kozuka |
| 5,250,840 A | | 10/1993 | Oh et al. |
| 5,252,853 A | | 10/1993 | Michii |
| 5,286,679 A | | 2/1994 | Farnworth et al. |
| 5,286,999 A | | 2/1994 | Chiu |
| 5,331,200 A | | 7/1994 | Teo et al. |
| 5,358,598 A | | 10/1994 | Chiu |
| 5,363,279 A | | 11/1994 | Cha |
| 5,406,028 A | | 4/1995 | Beng et al. |
| 5,428,247 A | | 6/1995 | Sohn et al. |
| 5,432,380 A | | 7/1995 | Jin et al. |
| 5,455,454 A | | 10/1995 | Oh et al. |
| 5,461,255 A | | 10/1995 | Chan et al. |
| 5,466,888 A | | 11/1995 | Beng et al. |
| 5,497,032 A | | 3/1996 | Tsuji et al |
| 5,535,509 A | | 7/1996 | Tomita et al. |
| 5,539,250 A | | 7/1996 | Kitano et al. |
| 5,539,251 A | | 7/1996 | Iverson et al.. |

(Continued)

Primary Examiner—Eddie Lee
Assistant Examiner—Thomas Magee
(74) Attorney, Agent, or Firm—TraskBritt

(57) ABSTRACT

A configuration for a conventional lead frame for conserving limited leads and for allowing the location of bond pads anywhere on the periphery of the semiconductor device and for reducing the cost of tooling changes by permitting the use of current tooling. The present invention utilizes an extended lead finger that extends along the periphery of a semiconductor device to provide a power source or ground so that any number of bond pads may be used in any position without requiring additional leads or tooling changes.

13 Claims, 4 Drawing Sheets

U.S. PATENT DOCUMENTS

| | | |
|---|---|---|
| 5,563,443 A * | 10/1996 | Beng et al. .................. 257/666 |
| 5,585,600 A | 12/1996 | Froebel et al. |
| 5,648,681 A | 7/1997 | Takashima et al. |
| 5,763,945 A | 6/1998 | Corisis et al. |
| 5,777,345 A * | 7/1998 | Loder et al. ................. 257/777 |
| 5,907,184 A | 5/1999 | Corisis et al. |
| 6,087,720 A * | 7/2000 | Corisis et al. .............. 257/692 |
| 6,329,710 B1 | 12/2001 | Corisis et al. |
| 6,410,987 B1 * | 6/2002 | Kanemoto et al. .......... 257/777 |
| 6,445,067 B1 | 9/2002 | Corisis et al. |

\* cited by examiner

INTEGRATED CIRCUIT PACKAGE ELECTRICAL ENHANCEMENT WITH IMPROVED LEAD FRAME DESIGN

CROSS-REFERENCE TO RELATED APPLICATIONS

This application is a continuation of application Ser. No. 10/218,335, filed Aug. 13, 2002, now U.S. Pat. No. 6,630,733, issued Oct. 7, 2003, which is a continuation of application Ser. No. 09/943,845, filed Aug. 30, 2001, now U.S. Pat. No. 6,445,067, issued Sep. 3, 2002, which is a continuation of application Ser. No. 09/539,092, filed Mar. 30, 2000, now U.S. Pat. No. 6,329,710 B1, issued Dec. 11, 2001, which is a continuation of Ser. No. 09/294,185, filed Apr. 19, 1999, now U.S. Pat. No. 6,087,720, issued Jul. 11, 2000, which is a continuation of application Ser. No. 09/047,726, filed Mar. 25, 1998, now U.S. Pat. No. 5,907,184, issued May 25, 1999, which is a continuation of application Ser. No. 08/713,798, filed Sep. 13, 1996, now U.S. Pat. No. 5,763,945, issued Jun. 9, 1998.

BACKGROUND OF THE INVENTION

1. Field of the Invention

The present invention relates generally to lead frames used for electrical connection to a semiconductor device. More specifically, the present invention relates to an enhanced lead frame having one or more power source or ground leads of a conventional lead frame extending along a portion of the periphery of the semiconductor device.

2. State of the Art

Well known types of semiconductor devices are connected to a component known as lead frames and subsequently encapsulated in plastic for use in a wide variety of applications. The lead frame is typically formed from a single, continuous sheet of metal, typically by metal stamping or chemical etching operations. A "conventional" lead frame usually includes an outer supporting frame, a central semiconductor device support pad (paddle), and a plurality of lead fingers, each lead finger having, in turn, a terminal bonding portion near the central semiconductor device supporting pad. In the assembly of semiconductor devices utilizing such lead frames, a semiconductor device is secured to the central supporting pad, a paddle (such as by a solder or epoxy die-attach, although a double-sided adhesive tape-type attach has also been suggested in the art). The lead fingers are electrically connected to bond pads on the semiconductor device using fine wires. In a standard wire bonding process, the bond wires are attached, one at a time, from each bond pad on the semiconductor device and to a corresponding lead finger of the lead frame. The bond wires are generally attached through one of three industry-standard wire bonding techniques: ultrasonic bonding—using a combination of pressure and ultrasonic vibration bursts to form a metallurgical cold weld; thermocompression bonding—using a combination of pressure and elevated temperature to form a weld; and thermosonic bonding—using a combination of pressure, elevated temperature, and ultrasonic vibration bursts. After the wire bonds between the contact pads of the semiconductor device and the lead fingers are made, the semiconductor device and wire bonds are typically encapsulated in plastic using a transfer or injection molding process. Finally, the rails of the outer supporting frame of the lead frame are removed leaving portions of the lead fingers extending beyond the encapsulated semiconductor device.

One common variation on this arrangement is to eliminate the die support pad or paddle and attach the semiconductor device to the lead fingers of the lead frame using an alpha barrier such as a polyamide tape, for example Kapton™ tape. In such an arrangement, a so-called "leads-over-chip" arrangement ("LOC"), a plurality of lead fingers extend over the active surface of a semiconductor device toward one or more lines of bond pads wherein bond wires make the electrical connection between the lead fingers and the bond pads. Examples of such LOC configurations are shown in U.S. Pat. No. 4,862,245 to Pashby and U.S. Pat. No. 5,286,679 to Farnsworth et al. assigned to the assignee of the present invention.

In a conventional lead frame configuration, some of the lead fingers carry a signal to the semiconductor device while others provide a power source or a ground. In a LOC frame configuration, the lead fingers likewise provide a signal to the semiconductor device but the power source and ground are typically provided by bus bars. The bus bars typically form elongated contact portions in close proximity to the one or more lines of bond pads on the active surface of the semiconductor device, each bus bar having the contact portion thereof extending perpendicular to the other lead fingers and over the active surface of the semiconductor device.

It is often necessary to change the design and internal configuration of a semiconductor device as specification requirements change and as advancements and improvements are made in technology. As these changes are made, it may become necessary to relocate the position of the bond pads that will receive power or provide a ground and also to add additional power source and ground bond pads. This situation causes difficulties because there is often a limited number of lead fingers of a lead frame available to provide for signals, a power source, and a ground. That is, adding another power source or ground bond site at a different location on the semiconductor device may not be possible if there is not an available lead finger of the lead frame. Alternatively, it may be necessary to maintain the position of the bond pad and route the power source and ground internally in the semiconductor device. However, internal power and ground buses add to the size of the semiconductor device and decrease its speed and performance, making this alternative device design often unacceptable. In addition, changes in the semiconductor device design can require changes in production equipment and tooling, such as wire bonding and molding equipment, which are very costly.

Therefore, it would be advantageous to develop a lead frame configuration that would conserve the limited number of lead fingers that would help improve the speed of the semiconductor device, that would help accommodate varying sizes of semiconductor devices, and that would accommodate varying bond pad locations on semiconductor devices. In addition, it would be advantageous to develop a lead frame that would accommodate changes in semiconductor device design while taking advantage of current tooling such as molding equipment.

The use of bus bars has been directed at LOC lead frame configurations and is illustrated in U.S. Pat. Nos. 4,862,245 and 5,286,679. However, such methods do not address the problem of limited leads on conventionally configured lead frames having lead fingers located about the periphery of the semiconductor device which many manufacturers of semiconductor devices are equipped to assemble, wire bond, and encapsulate such semiconductor devices thereto. The cost of converting or replacing equipment, especially wire bonding and molding equipment, to produce LOC lead frame configurations, rather than conventional lead frame configurations, can be very costly.

The use of a metallic film with the semiconductor device to provide contact with the power supply is disclosed in U.S. Pat. No. 5,497,032 to Tsuji et al. The metallic film may be divided into several separate zones in order to provide contact with different power supply systems and grounds. However, such a process requires the additional parts of the film and an insulator to separate the lead frame from the film. Also, an additional step of mounting the semiconductor device to the film is required.

The present invention is directed to an enhanced lead frame having one or more power source or ground leads of a conventional lead frame extending along a portion of the periphery of the semiconductor device.

BRIEF SUMMARY OF THE INVENTION

The present invention is directed to the configuration of a lead frame that conserves the limited number of leads, provides for changing power and ground arrangements, helps increase the speed of the semiconductor device, allows the use of varying sizes of semiconductor devices with the lead frame, allows differing locations of bond pads on the semiconductor device for connections with the lead frame, and reduces costly production equipment and tooling changes. The present invention comprises a modified conventional lead frame with the power and ground leads or buses extending around a portion of the periphery of the semiconductor device. The modified conventional lead frame of the present invention includes either a support paddle for the semiconductor device formed as part of the lead frame or a piece of tape for supporting the semiconductor device.

BRIEF DESCRIPTION OF THE SEVERAL VIEWS OF THE DRAWINGS

The present invention will be better understood when the description of the invention is taken in conjunction with the drawings wherein.

DETAILED DESCRIPTION OF THE INVENTION

Figure 1:
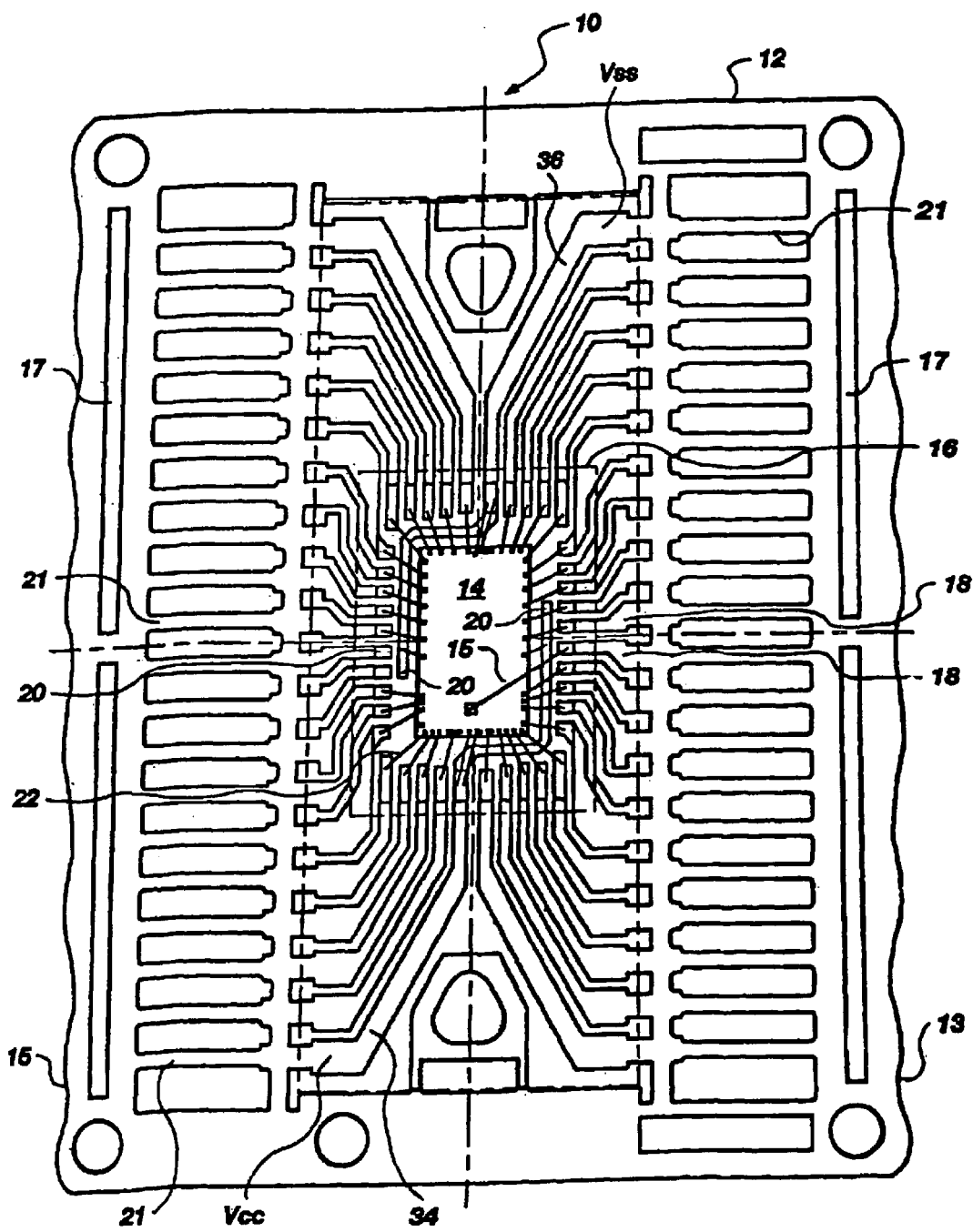
FIG. 1 is a schematic top view of a semiconductor integrated circuit device in accordance with the present invention including a first embodiment of an extended lead finger.
Figure 2:
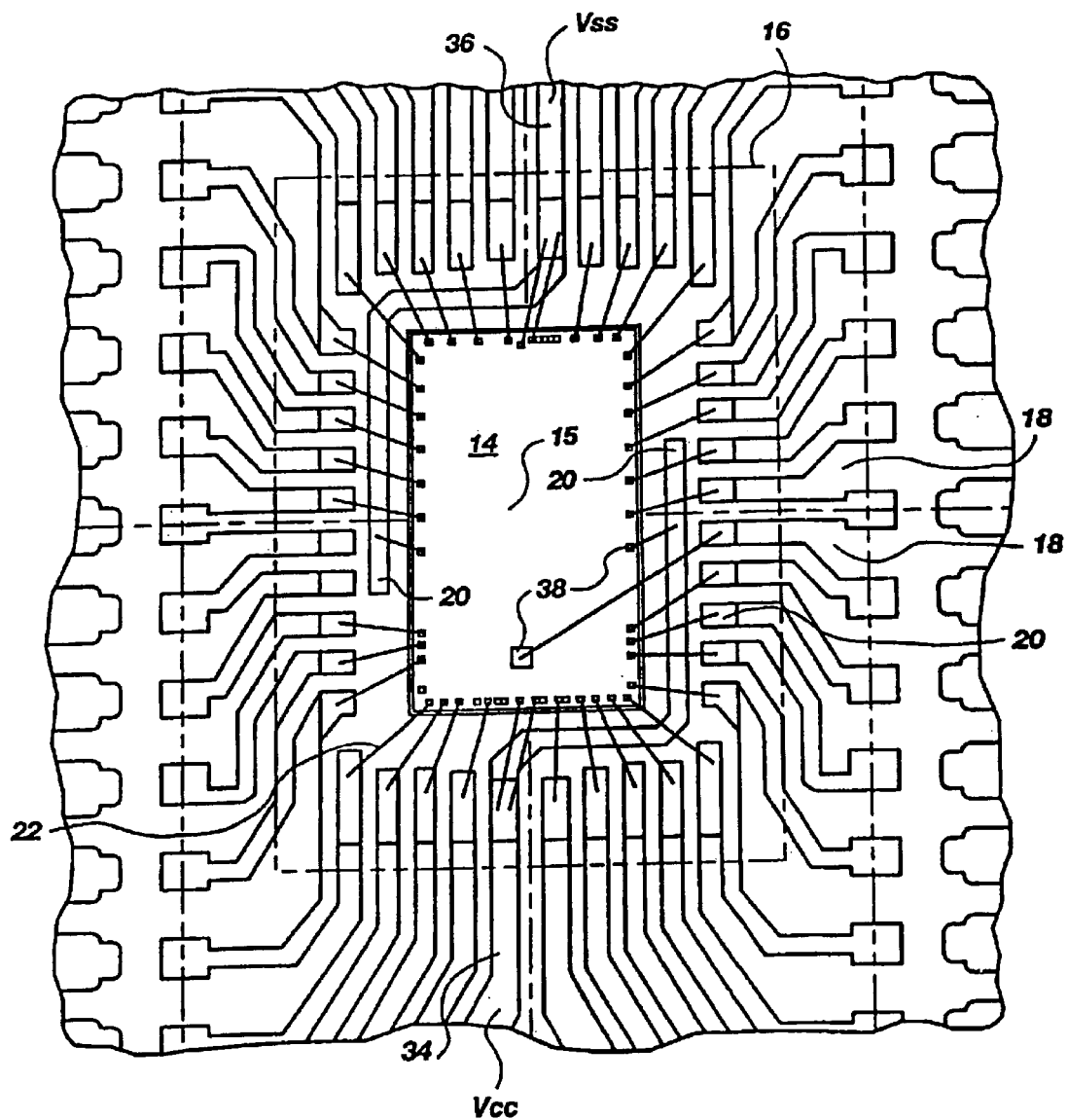
FIG. 2 is a close-up partial top view of the lead frame configuration of FIG. 1 in accordance with the present invention.

Referring to drawing FIGS. 1 and 2, a semiconductor integrated circuit (IC) device 10 is shown including a portion of a modified conventional-type lead frame 12 of the present invention. Typically, the lead frame 12 is part of a lead frame strip comprised of a plurality of lead frames extending from broken edges 13 and are repeated about the slits 17. The lead frame 12 includes a plurality of lead fingers 18 that extend toward the center of lead frame 12 forming the periphery of a semiconductor area in which the semiconductor device 14 is attached. Each of the lead fingers 18 includes a lead end 20 at a proximal end that is wire bonded to the semiconductor device 14 by wire bond 22 and a lead connection 21 at a distal end for electrically connecting the completed IC package. Typically, the lead ends 20 are plated to achieve a sufficient bond between the wire bond 22 and the lead end 20.

In the first embodiment of the present invention, the modified lead frame 12 does not include a die paddle for supporting the semiconductor device 14. Rather, the semiconductor device 14 is supported by tape 16. The tape 16 is attached to the bottom surface of lead fingers 18 of the lead frame 12 and the bottom surface of semiconductor device 14 through the use of a suitable adhesive, such as a thermoplastic or thermosetting adhesive or epoxy paste.

Because lead frame 12 does not include a die paddle for supporting the semiconductor device 14, the $V_{cc}$ (power) lead 34 and $V_{ss}$ (ground) lead 36 each can be extended to have a portion thereof surrounding a portion of a side of the semiconductor device 14. As shown, the leads 34 and 36 each have a portion surrounding a portion of two sides of the periphery of the semiconductor device 14.

Referring to drawing FIG. 2, the $V_{cc}$ lead 34 has been extended and routed around a portion of the periphery of semiconductor device 14. Similarly, the $V_{ss}$ lead 36 has also been extended and routed around an opposite portion of the periphery of semiconductor device 14. The $V_{cc}$ and $V_{ss}$ leads 34, 36, respectively, extend substantially parallel to the sides of the semiconductor device 14 and substantially perpendicular to a portion of the lead fingers 18 of the lead frame 12. Each of the $V_{cc}$ and $V_{ss}$ leads 34, 36, respectively, has a single lead end 20 at a proximal end that terminates near or adjacent the semiconductor device 14 and a single lead connection 21 at a distal end. In this manner, the position and number of bond pads 38 are not limited to a single location on the periphery of semiconductor device 14 nearest the lead end of the $V_{cc}$ lead 34 or $V_{ss}$ lead 36. Rather, the bond pads 38 requiring a ground or power source may be located anywhere along either the sides of the semiconductor device 14 forming the periphery of the semiconductor device 14 or located anywhere on the active surface 15 of the semiconductor device 14. In this manner, the $V_{cc}$ lead 34 and $V_{ss}$ lead 36 act much like the bus bars in a LOC configured lead frame. The wire bonds 22 extend over the $V_{cc}$ lead 34 and $V_{ss}$ lead 36 between the bond pads 38 and the lead ends 20. Providing the extended $V_{cc}$ and $V_{ss}$ leads 34, 36, respectively, around the periphery of the semiconductor device 14 also helps decrease the number of power and ground buses required within the semiconductor device itself, thereby helping to decrease its size and increase the speed and performance of the semiconductor device 14.

Figure 3:
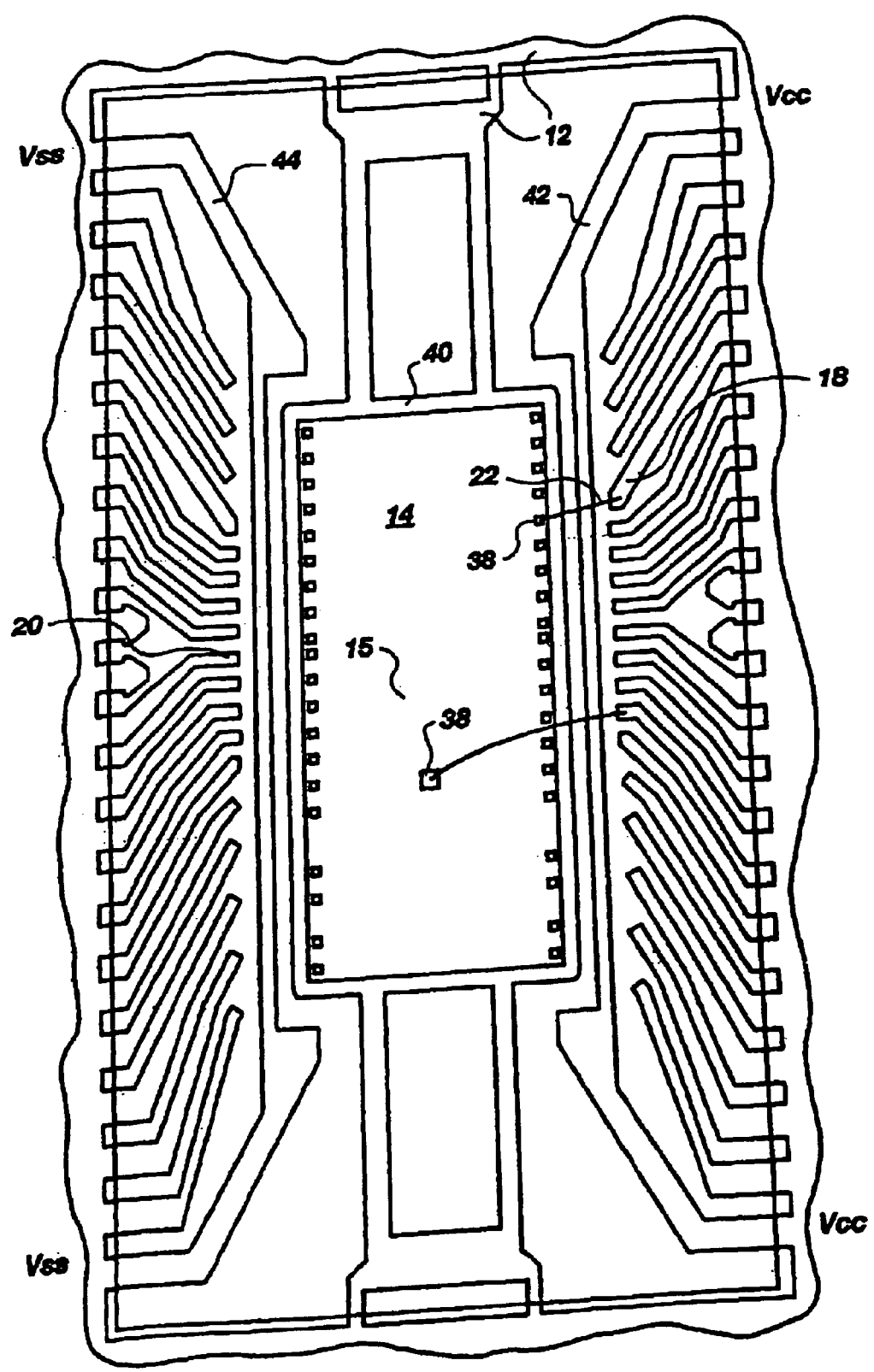
FIG. 3 is a close-up partial top view of a lead frame configuration in accordance with the present invention including a second embodiment of an extended lead finger.

Referring to drawing FIG. 3, a second embodiment of the present invention shows a semiconductor device including a portion of a modified conventional-type lead frame 12. The lead frame 12 includes a plurality of lead fingers 18 that extend toward the center of lead frame 12. Each of the lead fingers 18 includes a lead end 20 at a proximal end that is wire bonded to the semiconductor device 14 by wire bond 22 and a lead connection (not shown) at a distal end for electrically connecting the completed IC package. The lead fingers 18 are electrically connected, as described hereinbefore, to the bond pads 38 of the semiconductor device 14 by a wire bond 22.

In the second embodiment of the present invention, the modified lead frame 12 includes a die paddle 40 to support the semiconductor device 14. The semiconductor device 14 may be adhesively attached to the die paddle 40 by means of thermosetting or thermoplastic adhesive or epoxy paste.

The $V_{cc}$ lead 42 extends along the length, a side or first side, of the semiconductor device 14, rather than terminating at a proximal end as the other lead fingers 18, and extends substantially perpendicular with respect to a portion of the lead fingers 18 and at an angle with respect to other lead fingers 18. Similarly, the $V_{ss}$ lead 44 also extends along the opposite length, another side or second side, of the semiconductor device 14 in the same manner as $V_{cc}$ lead 42. As shown, the $V_{cc}$ and $V_{ss}$ leads 42, 44, respectively, extend substantially parallel to each other and to two of the sides of the semiconductor device 14. Unlike the first embodiment of the present invention, the $V_{cc}$ and $V_{ss}$ leads 42, 44 in the present embodiment do not terminate near the semiconductor device but, rather, are connected at each end thereof to the lead frame 12. Also unlike the first embodiment of the present invention, the $V_{cc}$ and $V_{ss}$ leads 42, 44, respectively, in the second embodiment form a continuous lead along the length of the semiconductor device 14 with each end terminating as a lead connection (not shown). In this manner, the position and number of bond pads 38 are not limited to a single location on the periphery or on the active surface 15 of semiconductor device 14 nearest the lead end of the $V_{cc}$ lead 42 or $V_{ss}$ lead 44. Rather, the bond pads 38 requiring a ground or power source may be located anywhere along the periphery or the active surface 15 of the semiconductor device 14. In this manner, the $V_{cc}$ lead 42 and $V_{ss}$ lead 44 of a conventional lead frame 12 act much like the bus bars in a LOC configured lead frame. The wire bonds 22 extend over the $V_{cc}$ lead 42 and $V_{ss}$ lead 44 between the bond pads 38 and the lead ends 20. Unlike the bus bars in a LOC configured lead frame, however, the $V_{cc}$ lead 42 and $V_{ss}$ lead 44 of the conventional lead frame 12 do not extend over the active surface 15 of semiconductor device 14. Providing the $V_{cc}$ and $V_{ss}$ leads 42, 44, respectively, around the periphery of the semiconductor device also helps decrease the number of power and ground buses within the semiconductor device 14 itself, thereby helping to decrease its size and increase the speed and performance of the semiconductor device 14.

Figure 4:
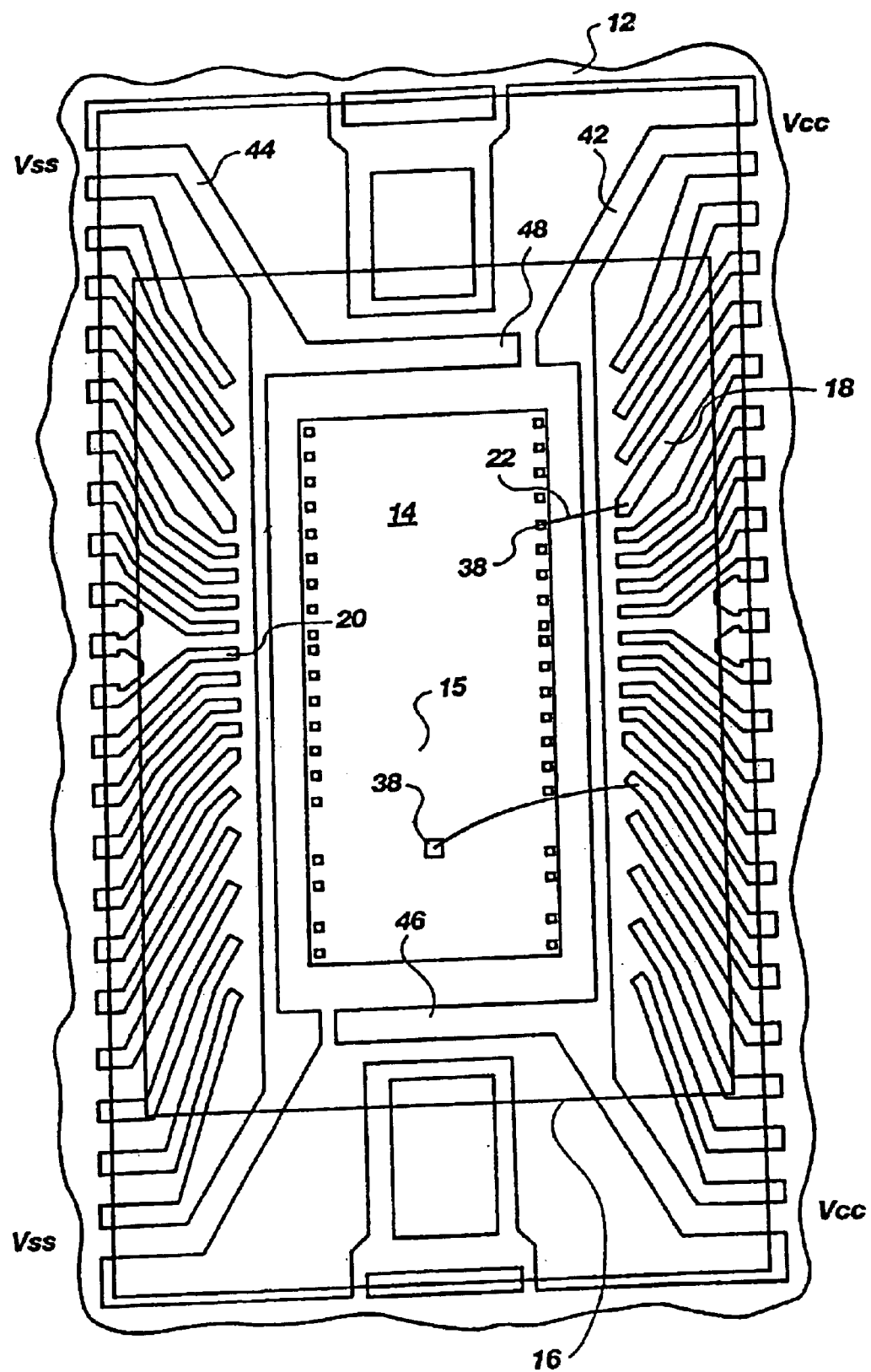
FIG. 4 is a close-up partial top view of a lead frame configuration in accordance with the present invention including a third embodiment of an extended lead finger.

Referring to drawing FIG. 4, a third embodiment of the present invention illustrates a semiconductor device 14 including a portion of a modified conventional-type lead frame 12. The lead frame 12 includes a plurality of lead fingers 18 that extend toward the center of lead frame 12, forming a semiconductor device area where the semiconductor device 14 is attached. Each of the lead fingers 18 includes a lead end 20 at a proximal end that is wire bonded to the semiconductor device 14 by wire bond 22 and a lead connection (not shown) at a distal end for electrically connecting the completed IC package. The lead fingers are electrically connected to the bond pads 38 of the semiconductor device 14 by a wire bond 22 as described hereinbefore.

In the third embodiment of the present invention, the lead frame 12 does not include a die paddle for supporting the semiconductor device 14. Rather, the semiconductor device 14 is supported by tape 16. The tape 16 is attached to the bottom surface of the lead fingers 18 of the lead frame 12 and the bottom surface of semiconductor device 14 through the use of a suitable adhesive, such as a thermoplastic or thermosetting adhesive.

Since the lead frame 12 does not include a die paddle for supporting the semiconductor device 14, the $V_{cc}$ lead 42 and $V_{ss}$ lead 44 can be extended to surround a greater portion of the periphery of the semiconductor device 14, i.e., multiple sides of the semiconductor device 14 or portions thereof. The $V_{cc}$ lead 42 is bifurcated to form a first portion extending along the ends 20 of lead fingers 18 and a side or first side of the periphery of the semiconductor device 14 and a second transverse prong portion 46 to provide a power source along another side or second side of the periphery of semiconductor device 14. Similarly, $V_{ss}$ lead 44 is bifurcated to form a first portion extending along lead ends 20 of lead fingers 18 and another or third side of the periphery of the semiconductor device 14 and a second transverse prong portion 48 to provide a ground along another or fourth side of the periphery of semiconductor device 14. The $V_{cc}$ and $V_{ss}$ leads 42, 44, respectively, and the transverse prong portions 46, 48, respectively, extend substantially parallel to the sides of the semiconductor device 14. Unlike the prior second embodiment of the present invention utilizing a paddle, in the present embodiment the semiconductor device 14 may be substantially surrounded by the $V_{cc}$ and $V_{ss}$ leads 42, 44, respectively. In this manner, the position and number of bond pads 38 are not limited to a location on the periphery of semiconductor device 14 nearest the lead end of the $V_{cc}$ lead or $V_{ss}$ lead 42, 44, respectively. Rather, the bond pads 38 requiring a ground or power source may be located anywhere along the periphery or the active surface 15 of the semiconductor device 14. In this manner, the $V_{cc}$ lead 42 and $V_{ss}$ lead 44 become much like the bus bars in a LOC configured lead frame. The wire bonds 22 extend over the $V_{cc}$ lead 42 and $V_{ss}$ lead 44 between the bond pads 38 and the lead ends 20. Providing the extended $V_{cc}$ and $V_{ss}$ leads 42, 44, respectively, around the periphery of the semiconductor device also helps decrease the number of power and ground buses within the semiconductor device itself, and helps to decrease the size of the semiconductor device 14 and increase the speed and performance of the semiconductor device 14. Unlike the bus bars in a LOC configured lead frame, however, the $V_{cc}$ lead 42, $V_{ss}$ lead 44, and prongs 46, 48 do not extend over the active surface 15 of the semiconductor device 14.

In the prior embodiments, the $V_{cc}$ and $V_{ss}$ leads are depicted as positioned on opposite sides of the semiconductor device in a substantially symmetric orientation. However, the $V_{cc}$ and $V_{ss}$ leads may be configured to extend to any portion of the semiconductor device as is required by the needs of the device and in conformance with the purpose of the present invention.

What is claimed is:

1. A lead frame of a plurality of lead frames, the lead frame for a semiconductor device having a first surface having at least one bond pad located thereon and having a bottom surface, the lead frame comprising:

a lead frame of a plurality of lead frames, each lead frame located adjacent another lead frame having an opening located therebetween;

a plurality of lead fingers of the lead frame, each lead finger of the plurality having an end, at least a portion of the plurality of lead fingers having an opening for locating a semiconductor device therein having the plurality of lead fingers located adjacent to sides of the semiconductor device;

at least one bus bar having a portion extending along the end of each lead finger of the plurality of lead fingers and along a portion of one side of a semiconductor device when located in the opening; and a section of tape substantially rectangular in shape having an outer peripheral portion and a central portion for attaching at least a portion of the first surface of the semiconductor device thereto, the outer peripheral portion of the section of tape for attaching at least a portion of at least two ends of the lead fingers of the plurality of lead fingers thereto, the section of tape being attached to a portion of the at least one bus bar.

2. The lead frame of claim 1, wherein the lead frame includes at least two bus bars, each bus bar of the at least two bus bars having a longitudinal contact portion extending along the end of each lead finger of the plurality of lead fingers.

3. A lead frame of a plurality of lead frames for connecting a semiconductor device thereto having a periphery, the lead frame comprising:

a lead frame of a plurality of lead frames, each lead frame located adjacent another lead frame having an opening therebetween;

a plurality of lead fingers of the lead frame, each lead finger of the plurality of lead fingers having an end, at least a portion of the plurality of lead fingers defining a semiconductor device opening in the lead frame;

a die paddle for supporting the semiconductor device thereon; and at least two bus bars, each having at least a portion thereof extending along at least portions of two adjacent portions of the periphery of the semiconductor device, the at least two bus bars having a portion thereof extending along the end of the each lead finger of the plurality of lead fingers.

4. A lead frame of a plurality of lead frames for use with a semiconductor device having a periphery, the lead frame comprising:

a lead frame located adjacent another lead frame of a plurality of lead frames having an opening therebetween, the lead frame having a plurality of inwardly extending leads extending to an opening for a semiconductor device to be located therein, at least one lead of the plurality of inwardly extending leads having a portion extending along at least a portion of a length of at least two adjacent portions of the periphery of a semiconductor device and extending between the semiconductor device and another lead of the plurality of inwardly extending leads and a second inwardly extending lead extending along another portion of the length of the at least two adjacent portions of the periphery of a semiconductor device, the at least one lead of the plurality of inwardly extending leads for electrically connecting a semiconductor device to a power source.

5. The lead frame of claim 4, wherein the at least one lead of the plurality of inwardly extending leads electrically connects the semiconductor device to ground.

6. The lead frame of claim 4, wherein the at least one lead of the plurality of inwardly extending leads electrically connects the semiconductor device to a reference voltage.

7. The lead frame of claim 4, wherein the at least one lead of the plurality of inwardly extending leads substantially surrounds the at least two adjacent portions of the periphery of the semiconductor device.

8. The lead frame of claim 4, wherein the at least one lead of the plurality of inwardly extending leads is bifurcated.

9. The lead frame of claim 8, wherein a first portion of the at least one inwardly extending bifurcated lead extends along a first portion of the periphery of the semiconductor device and a second portion of the at least one inwardly extending bifurcated lead extends along another adjacent portion of the periphery of the semiconductor device.

10. The lead frame of claim 4, wherein the at least one lead of the plurality of inwardly extending leads extends along a portion of the periphery of the semiconductor device and the second inwardly extending lead extends along another opposite portion of the periphery of the semiconductor device.

11. The lead frame of claim 10, wherein the at least one lead of the plurality of inwardly extending leads substantially surrounds the semiconductor device and the second inwardly extending lead substantially surrounds the semiconductor device.

12. The lead frame of claim 10, wherein the at least one lead of the plurality of inwardly extending leads and the second inwardly extending lead are bifurcated forming a first portion and a second portion on the at least one lead of the plurality of inwardly extending leads and a first portion and a second portion on the second inwardly extending lead.

13. The lead frame of claim 12, wherein the first portion of the at least one bifurcated, inwardly extending lead extends along a first portion of the periphery of the semiconductor device and the second portion of the at least one bifurcated, inwardly extending lead extends along a second portion of the periphery of the semiconductor device and the first portion of the second bifurcated, inwardly extending lead extends along a third portion of the periphery of the semiconductor device and the second portion of the second bifurcated, inwardly extending lead extends along a fourth portion of the periphery of the semiconductor device.

* * * * *